(12) United States Patent
Schinella et al.

(10) Patent No.: US 6,426,286 B1
(45) Date of Patent: Jul. 30, 2002

(54) INTERCONNECTION SYSTEM WITH LATERAL BARRIER LAYER

(75) Inventors: Richard D. Schinella, Saratoga; Valeriy Sukharev, Cupertino, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/574,804

(22) Filed: May 19, 2000

(51) Int. Cl.$^7$ .............................................. H01L 21/28
(52) U.S. Cl. ...................... 438/627; 438/635; 438/637; 438/638
(58) Field of Search ................................ 438/688, 637, 438/622, 627, 625, 700, 735–740, FOR 355, 635; 428/698; 430/314; 257/758, 774, 750–752

(56) References Cited

U.S. PATENT DOCUMENTS

| | | | |
|---|---|---|---|
| 3,012,861 A | 12/1961 | Ling | 23/223.5 |
| 3,178,392 A | 4/1965 | Kriner | 260/46.5 |
| 3,832,202 A | 8/1974 | Ritchie | 106/287 |
| 3,920,865 A | 11/1975 | Laufer et al. | 427/220 |
| 4,705,725 A | 11/1987 | Glajch et al. | 428/405 |
| 5,194,333 A | 3/1993 | Ohnaka et al. | 428/405 |
| 5,858,879 A | 1/1999 | Chao et al. | 438/725 |
| 5,874,367 A | 2/1999 | Dobson | 438/787 |
| 5,874,745 A | 2/1999 | Kuo | 257/59 |
| 5,882,489 A | 3/1999 | Bersin et al. | 204/192.35 |
| 5,904,154 A | 5/1999 | Chien et al. | 134/1.2 |
| 5,926,738 A * | 7/1999 | Cronin et al. | |
| 6,127,257 A * | 10/2000 | Pintchovski et al. | |
| 6,130,167 A * | 10/2000 | Tao et al. | |
| 6,162,586 A * | 12/2000 | Sengupta et al. | |
| 6,204,192 B1 * | 3/2001 | Zhao et al. | |
| 6,214,716 B1 * | 4/2001 | Akram et al. | |
| 6,218,255 B1 * | 4/2001 | Fritzsinger et al. | |
| 6,232,223 B1 * | 5/2001 | Tran et al. | 438/637 |
| 6,277,726 B1 * | 8/2001 | Kitch et al. | 257/758 |
| 2002/0038911 A1 * | 4/2002 | Graas et al. | 257/763 |

OTHER PUBLICATIONS

Lazarouk et al ("Anisotropy of aluminum porous anodization process for VLSI planner metallization" pp. 651–656.*
Dobson, C.D., et al., "Advanced SiO$_2$ Planarization Using Silane and H$_2$O$_2$", *Semiconductor International*, Dec. 1994, pp. 85–88.

(List continued on next page.)

*Primary Examiner*—George Fourson
*Assistant Examiner*—Suk-San Foong
(74) *Attorney, Agent, or Firm*—Luedeka, Neely & Graham

(57) ABSTRACT

An interconnection system having a bottom metal layer that has a conduction layer with a sidewall and an overlying barrier layer. A lateral barrier layer is disposed adjacent the sidewall of the conduction layer, and an insulation layer is over the bottom metal layer. The insulation layer forms vias extending through the insulation layer to the bottom metal layer. A top metal layer extends through the vias to electrically contact the bottom metal layer. The overlying barrier layer and the lateral barrier layer are relatively resistant to interaction with the top metal layer as compared to the conduction layer.

8 Claims, 1 Drawing Sheet

OTHER PUBLICATIONS

Furusawa, Takeshi, et al., "Realibility of Low–Parasitic–Capacitance Multilevel Interconnection Using Surface–Densified Low–e Organic Spin–on Glass", *Extended Abstracts of the 1996 International Conference On Solid State Devices and Materials*, Yokohama, Japan, 1996, pp. 145–147.

Keller, F., et al., "Structure Features of Oxide Coatings on Aluminum", *Journal of the Electrochemical Society*, Sep., 1953, pp. 411–419.

Khanna, V.K., et al., "Effect of Moisture on the Dielectric Properties of Porous Alumina Films", *Sensors and Actuators*, vol. 5, 1984, pp. 187–198.

Lazarouk, S., et al. "Anisotropy of Aluminum Porous Anodization Process for VLSI Planar Metallization", *Advanced Metallization for Devices and Circuits—Science, Technology and Manufacturing Symposium*, San Francisco, CA, Apr. 4–8, 1994, pp. 621–656.

McClatchie, S., et al., "Low Dielectric Constant Oxide Films Deposited Using CVD Techiques", *1998 Proceedings Fourth International DUMIC Conference*, Feb. 16–17, 1998, pp. 311–318.

Peters, Laura, "Pursuing the Perfect Low–k Dielectric", *Semiconductor International*, vol. 21, No. 10, Sep., 1998, pp. 64–66, 68, 70, 72 and 74.

Wood, G.C., et al., "The Direct Observation of Barrier Layers in Porous Anodic Oxide Films", *Journal of Electrochemical Society: Electrochemical Science*, vol. 115, No. 6, Jun., 1968, pp. 618–620.

* cited by examiner

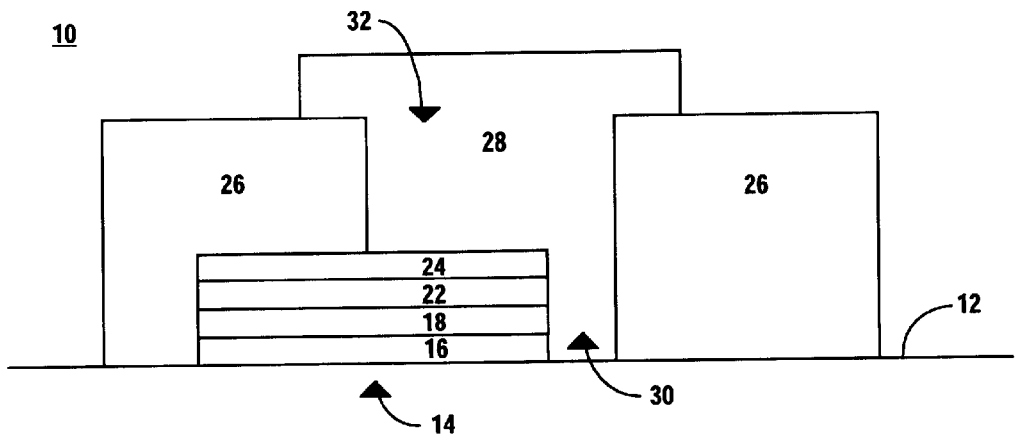
Fig. 1 - Prior Art
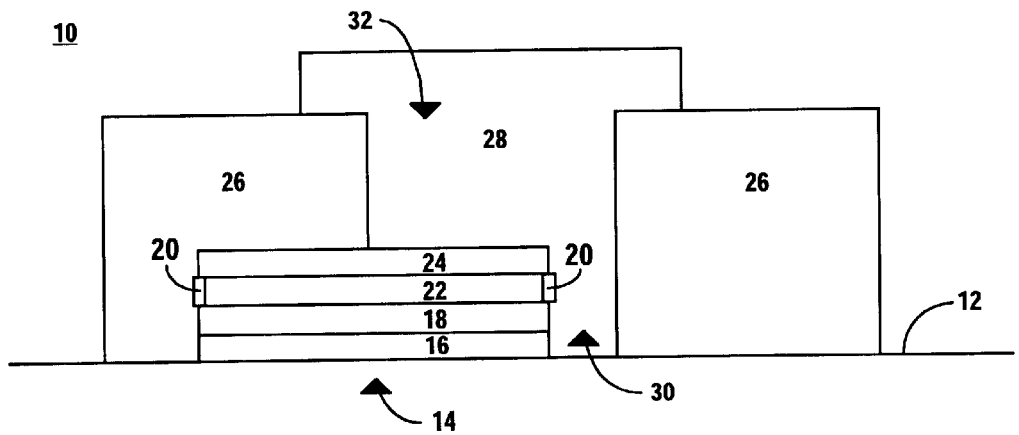
Fig. 2
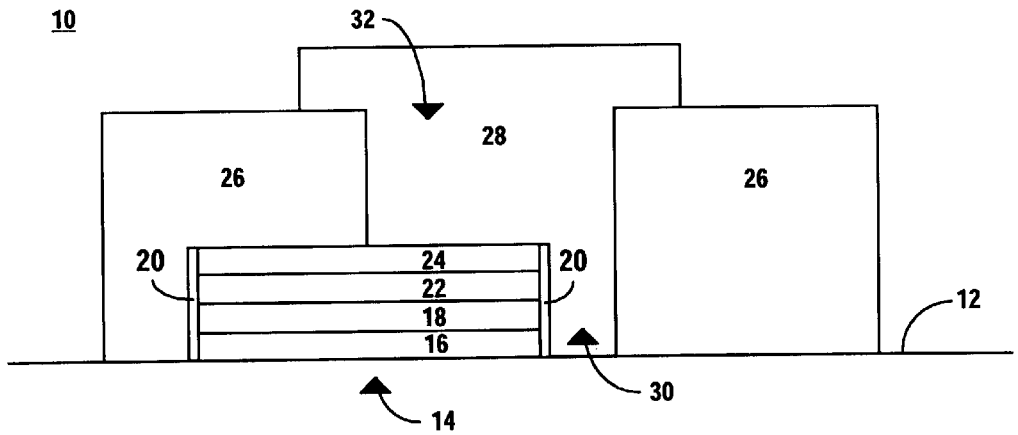
Fig. 3

INTERCONNECTION SYSTEM WITH LATERAL BARRIER LAYER

RELATED APPLICATION

The subject matter of this application relates to the subject matter of the co-pending application identified by Ser. No. 09/574,771 and filed on the same date as this application.

FIELD

This invention relates to the field of semiconductor processing. More particularly the invention relates to a conduction layer that is treated to resist erosion and undesirable interaction with other layers.

BACKGROUND

In general concept, integrated circuits are typically formed as a multitude of individual devices that are electrically connected one to another. The devices are often formed in a material, such as a semiconductor material, and the electrical connections that provide communication between the active devices are typically formed of another material, such as a metal or a series of metals, or a different phase of the semiconductor material, such as doped polysilicon.

In the example of the conduction layer that is formed of a series of metals, each of the individual metal layers in the conduction layer stack is typically selected to provide a specific function for the conduction stack as a whole. For example, a first deposited layer of the conduction stack may be selected for its ability to adhere tightly to the underlying material. As a specific example of a metal that performs this function, titanium can be used as an adhesion layer on top of silicon, as it adheres very tightly to both the silicon and the silicon oxide that may be beneath it, and tends to prevent the conduction stack from peeling off of the underlying silicon and silicon dioxide.

A second metallic layer may be used to prevent interaction between any of layers below it with any of the layers above it. Titanium nitride may be used to prevent reactions between a titanium adhesion layer and an aluminum layer, or between an aluminum layer and an underlying silicon substrate. An aluminum layer may be used as a primary conduction layer for the communication of electrical charges. Finally, the primary conduction layer may be overlaid with an optical antireflection layer, so that the entire conduction stack can be more easily patterned using photolithographic techniques.

After all of these layers have been sequentially deposited, the conduction stack is patterned with the specific geometry that is desired for the layer. This is most typically accomplished by coating the conduction stack with a layer of photoresist, exposing the photoresist to a mask pattern, developing the photoresist to remove the photoresist from those areas where the conduction stack is also to be removed, and then etching away those portions of the conduction stack that are exposed. The etching may be accomplished by means of either a physical etch, such as by ion bombardment, or a chemical etch, such as in an acid solution. These two types of etching can be combined such as in a reactive ion etch, which combines elements of both a physical and a chemical etch.

After the conduction stack has been patterned, it is typically covered with an insulating layer of a material that has a high dielectric coefficient, such as silicon oxide. Holes are then etched through the dielectric layer to make contact to the underlying conduction stack. The contact holes are called vias. The topmost layer of the underlying conduction stack often has another function that is used during the formation of the vias. The topmost layer may be selected so as to provide a positive stop to the etching process used to form the vias. Thus, the etchant method as described above etches completely through the dielectric layer, but does not etch appreciably into the conduction stack. In other words, the topmost layer of the conduction stack is selected so to not be appreciably attacked by the etchant that is used to etch the vias. In this manner, the vias are completely etched out, but the conduction stack is not attacked or diminished either physically or chemically by the etchant.

After the vias to the underlying conduction stack are etched, a top conduction layer is deposited, which top layer makes electrical contact to the underlying conduction stack through the vias. At this point, yet another function of the topmost layer of the conduction stack is utilized. The topmost layer of the conduction stack is selected so as to not react with the material of the top conduction layer, and additionally may act as a barrier between the material of the top conduction layer and the underlying layers of the conduction stack. Therefore, it is often preferred that the vias completely overly only contiguous upper surfaces of the underlying conduction stack.

Unfortunately, as the geometries of integrated circuits decrease, it becomes increasingly harder to align the via openings to a contiguous upper surface of the underlying conduction stack. Often, a portion of the via opening contacts the underlying conduction stack at the patterned edge of the conduction stack. Thus, a first portion of the via overlies the upper surface of the conduction stack, and another portion of the via overlies the sidewall of the patterned edge of the conduction stack. While such a misalignment may still provide an overlap between the underlying conduction layer and the top conduction layer that is sufficient for electrical conductivity and adequate current flow, there are other problems that are brought about by the misalignment. For example, if the material of the topmost layer of the conduction stack is preferentially selected to provide an etch stop during the via etch, then this function is not provided to those edges of the underlying layers of the conduction stack that are exposed by the misaligned via that partially overlaps the edge of the patterned conduction stack.

Further, and in a similar vein, if the material of the topmost layer of the conduction stack is preferentially selected to provide a barrier between the top conduction layer and the underlying layers of the lower conduction stack, then this function is also not provided to those edges of the underlying layers of the conduction stack that are exposed by the misaligned via that partially overlaps the edge of the patterned conduction stack.

What is needed, therefore, is a process to produce a conduction stack that tolerates the problems associated with misalignment of the vias without the loss of the functionality that typically accompanies such misalignment.

SUMMARY

The above and other needs are met by an interconnection system having a bottom metal layer that has a conduction layer with a sidewall and an overlying barrier layer. A lateral barrier layer is disposed adjacent the sidewall of the conduction layer, and an insulation layer is over the bottom metal layer. The insulation layer forms vias extending through the insulation layer to the bottom metal layer. A top metal layer extends through the vias to electrically contact the bottom metal layer. The overlying barrier layer and the lateral barrier layer are relatively resistant to interaction with the top metal layer as compared to the conduction layer.

Thus, the interconnection system described above solves the problems recited above by providing a lateral barrier layer that protects the conduction layer of the bottom metal layer. The lateral barrier layer is relatively resistant to interaction with the top metal layer, as compared to the conduction layer. This is significant for those occasions when the vias are misaligned to the bottom metal layer and at least partially overlie the patterned sidewall of the bottom metal layer. In a typical bottom metal layer stack, this situation presents an exposed sidewall surface of the conduction metal layer. However, in the structure described above, the top metal layer does not degrade the function or integrity of the conduction layer in any way, because the lateral barrier keeps the top metal layer and the conduction layer from contacting one another. Further, the lateral barrier layer reduces erosion of the conduction layer during the via etch process.

In various preferred embodiments, the conduction layer is aluminum and the overlying barrier layer is titanium nitride. The lateral barrier layer is preferably aluminum oxide. In a most preferred embodiment the bottom metal layer has an adhesion layer of titanium, an underlying barrier layer of titanium nitride, a conduction layer of aluminum, and an overlying barrier layer of titanium nitride.

In a method for producing an interconnection system according to the present invention, a bottom metal layer is deposited by depositing a conduction layer and forming an overlying barrier layer. The bottom metal layer is patterned to produce a patterned bottom metal layer having a sidewall. A lateral barrier layer is formed against the sidewall of the bottom metal layer, and an insulation layer is deposited over the bottom metal layer. Vias are etched through the insulation layer to the bottom metal layer using an etchant. The overlying barrier layer and the lateral barrier layer are relatively resistant to the etchant as compared to the insulation layer. A top metal layer is deposited through the vias to electrically contact the bottom metal layer. The overlying barrier layer and the lateral barrier layer are relatively resistant to interaction with the top metal layer as compared to the conduction layer.

Thus, this method produces a bottom metal layer where at least the sidewall of the conduction layer is protected by the lateral barrier layer. Therefore, when the vias are misaligned and the sidewall of the patterned bottom metal layer is exposed in the via, the sidewall of the conduction layer will not contact the overlying top metal layer. Further, the etchant used to create the via will similarly not contact the sidewall of the conduction layer.

Various different preferred methods may be used to form the lateral barrier layer. For example, the lateral barrier layer can be formed against the sidewall of the bottom metal layer by interacting the sidewall of the bottom metal layer with one or more of a liquid chemical, a gas, or a plasma. The lateral barrier layer may be formed adjacent the entire sidewall of all of the different layers of the bottom metal layer, or adjacent just the sidewall of the conduction layer of the bottom metal layer. Further, the lateral barrier layer may be formed by deposition, such as by a chemical reaction or a plasma deposition.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 1 is a cross sectional view of a prior art bottom metal layer,

FIG. 2 is a cross section view of a bottom metal layer with a lateral barrier layer on the sidewall of the conduction layer, and FIG. 3 is a cross section view of a bottom metal layer with a lateral barrier layer on the sidewall of the bottom metal layer.

DETAILED DESCRIPTION

Referring now to FIG. 1, there is depicted a prior art interconnection system 10. As depicted in FIG. 1, the bottom metal layer 14 is comprised of four different metal layers. It is appreciated that this number of individual metal layers, and the specific metal layers as described below are by way of example only, and that the invention is similarly applicable to bottom metal layers having other numbers of and types of individual component metal layers.

As depicted in the example of FIG. 1, the first layer 16 of the bottom metal layer 14 is an adhesion layer to aid in the adhesion of the bottom metal layer 14 to the substrate 12. For example, for a silicon substrate 12, a first layer 16 of about 200 angstroms of titanium provides a good adhesion layer between the silicon substrate 12 and the rest of the bottom metal layer 14.

Overlying the first layer 16 is a second layer 18, which is a lower barrier layer designed to reduce interaction between the first layer 16 or the substrate 12 and the layers that are to be deposited on top of the second layer 18. For example, a second layer 18 of 300 angstroms of titanium nitride provides a good lower barrier layer between titanium or silicon and other layers on top of the second layer 18.

Overlying the second layer 18 is a third layer 22, which is a conduction layer designed to carry the majority of the electrical charges through the bottom metal layer 14. For example, 5,000 angstroms of aluminum can be used as a third layer 22. The aluminum of the third layer 22 is relatively conductive as compared to the other layers of the bottom metal layer 14, and also is preferably deposited as a thicker layer than the other layers of the bottom metal layer 14, all of which increase the conductive properties of the third layer 22.

The aluminum of the third layer 22 tends to interdiffuse with either or both of the titanium of the first layer 16 and the silicon substrate 12. This interdiffusion reduces the effectiveness of the interconnection system 10. Thus, the barrier properties of the titanium nitride second layer 18 are valuable in reducing the interdiffusion and enhancing the desirable properties of the interconnection system 10 as described.

A fourth layer 24 is deposited on top of the third layer 22. The fourth layer 24 preferably performs one or more of several different functions. First, the fourth layer 24 is designed to be an optical antireflection coating to the third layer 22. In this manner, the third layer 22, which typically is very reflective, does not create complications during the photolithographic processing used to pattern the bottom metal layer 14. Second, the fourth layer 24 is designed to have a reduced degree of interaction with the etchant used to create the via above the bottom metal layer 14, as described more completely below. Third, the fourth layer 24 is designed to have a lesser relative degree of interaction with the top metal layer 28 as compared to the third metal layer 22, also as described more completely hereafter. For example, a 400 angstrom layer of titanium nitride functions well as a fourth layer 24.

After the bottom metal layer 14 is patterned, an insulating layer 26 of a dielectric material is deposited over the top of the bottom metal layer 14. The insulation layer 26 prevents electrical contact between the bottom metal layer 14 and the top metal layer 28 deposited on top of the insulating layer 26, except in specific, desired locations in the insulating layer 26. Where electrical contact between the top metal layer 28 and the bottom metal layer 14 is desired, vias 32 are etched in the insulating layer 26. Once the vias 32 are etched, electrical contact can be made between the bottom metal layer 14 and the top metal layer 28 that is deposited within the via 32.

It is appreciated that the top metal layer 28 may be comprised of several different metal layers, in a fashion similar to that described for the bottom metal layer 14 above. For example, the top metal layer 28 may be formed of a via plug that comes to the top of the via 32, and that is then overlaid with another layer that extends upwardly from the top surface of the insulating layer 26. Further, the surfaces of the via 32 may be coated with a metallic layer before the rest of the via 32 is filled with a metallic plug material. However, any such multiple top metal layers are simplified in the figures as a single component top metal layer 28.

As depicted in FIG. 1, the via 32 is misaligned with the bottom metal layer 14. In other words, the via 32 does not only overlie a contiguous portion of the fourth metal layer 24. Instead, a portion 30 of the via 32 is off to the side of the bottom metal layer 14, adjacent the patterned sidewall of the bottom metal layer 14. Thus, the material of the top metal layer 28 contacts the fourth metal layer 24 of the bottom metal layer 14 in that portion of the via 32 that overlies the bottom metal layer 14, and the material of the top metal layer 28 contacts the sidewall of the bottom metal layer 14 in that portion of the via 32 that does not overlie the bottom metal layer 14.

Because the sidewall of the bottom metal layer 14 is made by etching through all of the metal layers 16, 18, 22, and 24 of the bottom metal layer 14, the top metal layer 28 tends to contact all of the metal layers 16, 18, 22, and 24 of the bottom metal layer 14 at the sidewall of the bottom metal layer 14. This situation raises at least two concerns, as introduced above. First, the etchant used to create the via 32 tends to contact all of the metal layers 16, 18, 22, and 24 as the via 32 is etched. This contact occurs at the sidewalls of these four metal layers 16, 18, 22, and 24 as the insulating material 26 of the via 32 is etched down and away from the sidewalls of the four metal layers 16, 18, 22, and 24.

While the material used as the fourth metal layer 24 is specifically chosen to have a relatively high resistance to the etchant that is used to form the vias 32 in the insulating material 26, the material of the other three layers 16, 18, and 22 are selected for their other specific properties as described above, and may not necessarily have any appreciable resistance to the etchant used to form the vias 32. In the specific example described above, the material of the second layer 18 is described as being the same material as that used to form the fourth layer 24. However, this is only by way of example and is not necessarily true in all cases. Further, even if the second layer 18 and the fourth layer 24 are of the same material, this still leaves a problem with the first layer 16 and the third layer 22.

The problem is that as the etchant works down through the insulating material 26 in the area of the via 32, it starts to attack the third layer 22, the second layer 18, and the first layer 16 through their exposed sidewalls. The etchant, depending upon how vigorously it attacks the exposed layers 16, 18, and 22, may likewise etch out a significant amount of the exposed layers 16, 18, and 22. This tends to occur at different rates for the different exposed layers 16, 18, and 22 of the bottom metal layer 14, creating pockets and overhangs in the sidewall of the bottom metal layer 14.

At least two problems exist with the formation of these pockets. First, they are very difficult to clean out effectively, and especially in the case where a liquid etchant is used, not all of the etchant may be removed from the pockets. Thus, the etchant that remains behind in a pocket tends to continue etching, either very slowly or very quickly, and eroding the bottom metal layer 14 over a period of time, thus reducing the reliability of the integrated circuit. The second problem is that the pockets tend to be extremely difficult to fill with the material used for the top metal layer 28. Thus, the formation of these pockets is extremely undesirable.

The second problem associated with the situation of the misaligned via 32 is similar to the first problem introduced above. When the via 32 is misaligned and overhangs the patterned edge of the bottom metal layer 14, the material of the top metal layer 28 tends to contact all of the four metal layers 16, 18, 22, and 24 of the bottom metal layer 14 through the sidewall of the bottom metal layer 14. Similar to the explanation as given above for the problem with the etchant, while the material for the fourth layer 24 is specifically selected for not having undesirable interactions with the material selected for the top metal layer 28, the underlying three layers 16, 18, and 22 of the bottom metal layer 14 are all selected for other important properties, and not necessarily for any degree of reduced interaction with the material of the top metal layer 28.

As the material of the top metal layer 28 is deposited, it makes contact with the three layers 16, 18, and 22 of the bottom metal layer 14 at the sidewall of the bottom metal layer 14 in the portion 30 of the via 32 that is off to the side of the bottom metal layer 14. Therefore, the three underlying layers 16, 18, and 22 of the bottom metal layer 14 start to interact with the material of the top metal layer 28. Even though these interactions may be slow in occurring, they often tend to degrade the reliability of the integrated circuit.

FIG. 2 depicts the system 10 as introduced above with an additional lateral barrier layer 20 formed against the sidewall of the third metal layer 22 of the bottom metal layer 14. The function of the lateral barrier layer 20 is to protect the material of the third layer 22 from any undesirable interactions between either the etchant used to form the via 32 or the material of the top metal layer 28. Although depicted as formed only against the sidewall of the third metal layer 22, this is by way of example only. In other embodiments, the lateral barrier layer 20 is formed against the sidewall of all of the four layers 16, 18, 22, and 24 of the bottom metal layer 14, as depicted in FIG. 3, or against any combination of one or more of the layers 16, 18, 22, and 24.

Further, the lateral barrier layer 20 may be formed of several different components, such as a different component for each of the four different layers 16, 18, 22, and 24 of the bottom metal layer 14, where each of the different components is selected to reduce the interactions between the adjacent layer and the etchant, and either alternately or additionally between the adjacent layer and the material of the top metal layer 28. Further, the different components may also be selected based upon the ease of formation of the different components of the lateral barrier layer 20 against the different materials of the four different layers 16, 18, 22, and 24.

For the bottom metal layer 14 system described above, it may only be necessary to protect the sidewall of the third metal layer 22, which is formed of aluminum. Therefore, the examples given below tend to be more specific in regard to aluminum. However, it is appreciated that other bottom metal layer systems may have other or additional metals that require protection such as by a lateral barrier layer 20, and the invention as exemplified herein is equally applicable to such other metal systems.

The lateral barrier layer 20 is preferably formed after the bottom metal layer 14 has been patterned and before the insulating material of the dielectric layer 26 is deposited. It is at this point in the processing that the sidewall of the bottom metal layer 14 tends to be most accessible. Further, it is at this point in the processing that the sidewall of the bottom metal layer 14 has yet to be exposed to other processes that may be deleterious to the layers 16, 18, and 22 of the bottom metal layer 14, such as the via 32 etchant.

The lateral barrier layer 20 is, in one embodiment, formed by a traditional process of depositing a material and then etching away the deposited material from those areas where it is not wanted, either by masking and etching after the deposit, or masking prior to deposit and lifting off after deposit. However, methods of selective deposition or selective formation are more preferred for several reasons. For example, they tend to reduce the overall number of steps required for the formation of the lateral barrier layer 20. Additionally, they tend to reduce further complications with other elements of the integrated circuit that have already been formed, and which have not been mentioned in the limited discussion above.

One method of selectively forming the lateral barrier layer 20 is to oxidize the exposed sidewalls of the bottom metal layer 14. This can be accomplished with any one or more of a number of different methods, each of which may be specifically selected to target a specific component layer of the bottom metal layer 14, such as one or more of the layers 16, 18, or 22. Preferably, such a method does not oxidize the top surface of the fourth layer 24 of the bottom metal layer 14, as an ohmic contact between this layer and the top metal layer 28 is desired.

For example, the oxidation can be done in a liquid bath, such as in an acid bath that is selected to not significantly erode or remove material, but to convert the metal of one or more of the layers 16, 18, or 22 to an oxide. This conversion preferably occurs only at the sidewall of the bottom metal layer 14. Thus, as depicted in FIG. 2, the oxide of the lateral barrier layer 20 forms by converting some of the material of the third metal layer 22 into an oxide. The oxide of the lateral barrier layer 20 tends to be more resistant to both the etchant used to form the via 32, and to any interaction with the material of the top metal layer 28. Thus, an oxidant selected to specifically oxidize the third metal layer 22, for example, at a rate that is significantly greater than that at which any of the other exposed components of the integrated circuit are either eroded or oxidized, will tend to produce a lateral barrier layer 20 in a specifically targeted location.

The oxidation of the desired layers 16, 18, or 22 in the liquid bath can be augmented by the introduction of an electrical potential, such as in an anodization process, where the bottom metal layer 14 is biased with an electrical potential. This method can also be used to selectively deposit a barrier material on the biased metal layers.

The formation of the lateral barrier layer 20 can also be accomplished in a gaseous environment, such as an oxidizing gaseous environment. This method can be enhanced by introducing a plasma in the environment, making the gases more reactive to the exposed sidewall of the bottom metal layer 14. Again, the chemistry of the gaseous environment, and the other processing parameters inherent in a plasma, are preferably specifically selected so as to optimize the formation of the lateral barrier layer 20 on sidewalls of the desired layers 16, 18, or 22, while effecting other components of the integrated circuit to as small a degree as possible. These specific processing parameters are preferably selected based upon the specific selection of the different materials used for the various components of the integrated circuit.

For the specific example of an aluminum conduction layer 22, aluminum oxide is preferably formed as the lateral barrier layer 20, such as depicted in FIG. 2, according to one or more of the methods described above. Alternately, a different material is deposited, which material preferably satisfies the conditions that the deposited material resists removal during the etch of the dielectric material 26 to form the via 32, the material is compatible with the manufacturing process employed, and the material is compatible with the yield and reliability objectives for the structures created. Thus, a lateral barrier layer 20 overcomes the problems associated with vias 32 that are misaligned with the top surface of the bottom metal layer 14.

It is appreciated that the invention as described above comprehends numerous adaptations, rearrangements, and substitutions of parts, all of which are considered to be within the scope and spirit of the invention as described, and that the scope of the invention is only to be restricted by the language of the claims given below.

What is claimed is:

1. A method for producing an interconnection system between a bottom metal layer and a top metal layer, the method comprising the steps of:
    depositing the bottom metal layer by,
        depositing a conduction layer, and
        forming an overlying barrier layer on the conduction layer,
    patterning the bottom metal layer to produce a patterned bottom metal layer having a sidewall,
    selectively oxidizing the sidewall of the bottom metal layer to form a lateral barrier layer against the sidewall of the bottom metal layer,
    depositing an insulation layer over the bottom metal layer,
    etching vias through the insulation layer to the bottom metal layer using an etchant, where the overlying barrier layer and the lateral barrier layer are relatively resistant to the etchant as compared to the insulation layer,
    depositing the top metal layer through the vias to electrically contact the bottom metal layer, where the overlying barrier layer and the lateral barrier layer are relatively resistant to interaction with the top metal layer as compared to the conduction layer.

2. The method of claim 1, wherein the step of selectively oxidizing the sidewall of the bottom metal layer comprises interacting the sidewall of the bottom metal layer with a liquid chemical.

3. The method of claim 1, wherein the step of selectively oxidizing the sidewall of the bottom metal layer comprises interacting the sidewall of the bottom metal layer with a liquid chemical and applying an electrical potential to the bottom metal layer.

4. The method of claim 1, wherein the step of selectively oxidizing the sidewall of the bottom metal layer comprises interacting the sidewall of the bottom metal layer with an oxidizing gas.

5. The method of claim 1, wherein the step of selectively oxidizing the sidewall of the bottom metal layer comprises interacting the sidewall of the bottom metal layer with an oxidizing plasma.

6. A method for producing an interconnection system, the method comprising the steps of:

depositing a bottom metal layer by,
   depositing an adhesion layer,
   depositing an underlying barrier layer,
   depositing a conduction layer, and
   depositing an overlying barrier layer, patterning the bottom metal layer to produce a patterned bottom metal layer having a conduction layer sidewall, oxidizing the sidewall of the conduction layer to form a lateral barrier layer against the sidewall of the conduction layer, depositing an insulation layer over the bottom metal layer, etching vias through the insulation layer to the bottom metal layer using an etchant, where the overlying barrier layer and the lateral barrier layer are relatively resistant to the etchant as compared to the insulation layer, and depositing a top metal layer through the vias to electrically contact the bottom metal layer, where the overlying barrier layer and the lateral barrier layer are relatively resistant to interaction with the top metal layer as compared to the conduction layer.

7. The method of claim 6, wherein the conduction layer is aluminum and the lateral barrier layer is aluminum oxide.

8. The method of claim 6, wherein the sidewall of the conduction layer is oxidized in an oxygen containing plasma.

* * * * *